United States Patent
Chen et al.

(10) Patent No.: US 11,348,904 B2
(45) Date of Patent: May 31, 2022

(54) DISPLAY PANEL, MANUFACTURING METHOD AND DISPLAY DEVICE

(71) Applicant: BOE TECHNOLOGY GROUP CO., LTD., Beijing (CN)

(72) Inventors: Xiaochuan Chen, Beijing (CN); Jian Gao, Beijing (CN); Pengxia Liang, Beijing (CN); Xiandong Meng, Beijing (CN); Xianqin Meng, Beijing (CN); Jifeng Tan, Beijing (CN); Fangzhou Wang, Beijing (CN); Wei Wang, Beijing (CN); Han Yue, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 86 days.

(21) Appl. No.: 16/631,826

(22) PCT Filed: Jun. 4, 2019

(86) PCT No.: PCT/CN2019/089992
§ 371 (c)(1),
(2) Date: Jan. 16, 2020

(87) PCT Pub. No.: WO2020/001243
PCT Pub. Date: Jan. 2, 2020

(65) Prior Publication Data
US 2020/0152612 A1    May 14, 2020

(30) Foreign Application Priority Data
Jun. 29, 2018 (CN) .......................... 201810721037.1

(51) Int. Cl.
*H01L 25/075* (2006.01)
*H01L 33/58* (2010.01)
*H01L 33/60* (2010.01)

(52) U.S. Cl.
CPC .......... *H01L 25/0753* (2013.01); *H01L 33/58* (2013.01); *H01L 33/60* (2013.01); *H01L 2933/0058* (2013.01)

(58) Field of Classification Search
CPC ..... H01L 25/0753; H01L 33/58; H01L 33/60; H01L 2933/0058
See application file for complete search history.

(56) References Cited

U.S. PATENT DOCUMENTS 4,873,986 A * 10/1989 Wallace ................. A61B 5/035
600/483
2011/0198655 A1    8/2011 De Graaf et al.
(Continued)

FOREIGN PATENT DOCUMENTS

CN    106684108 A    5/2017
CN    106784203 A    5/2017
(Continued)

OTHER PUBLICATIONS

The International Search Report Issued in Application No. PCT/CN2019/089992, dated Sep. 10, 2019, (10p).

*Primary Examiner* — Jay C Chang
*Assistant Examiner* — Mikka Liu
(74) *Attorney, Agent, or Firm* — Arch & Lake LLP

(57) ABSTRACT

A display panel is disclosed, the display array including: a substrate; a functional layer on the substrate having a plurality of recesses, at least one of the recesses in a sub-pixel region forming a well structure with a sidewall formed of the functional layer and a bottom formed of the substrate; and a plurality of micro light emitting diodes (Micro LEDs) for emitting light, at least one of the Micro LEDs within a corresponding recess; wherein the functional layer is configured to prevent at least part of the light emitted by one of the Micro LEDs and incident on the sidewall of the
(Continued)

corresponding recess from being subsequently emitted through an adjacent sub-pixel region.

13 Claims, 5 Drawing Sheets

(56) References Cited

U.S. PATENT DOCUMENTS

| | | | | |
|---|---|---|---|---|
| 2014/0367633 | A1* | 12/2014 | Bibl | ............ H01L 27/322 |
| | | | | 257/13 |
| 2017/0133357 | A1* | 5/2017 | Kuo | ............ H01L 25/0753 |
| 2018/0315909 | A1 | 11/2018 | Li et al. | |

FOREIGN PATENT DOCUMENTS

| CN | 107195653 A | 9/2017 |
|---|---|---|
| CN | 108878626 A | 11/2018 |

\* cited by examiner

DISPLAY PANEL, MANUFACTURING METHOD AND DISPLAY DEVICE

CROSS-REFERENCE TO RELATED APPLICATIONS

This application is the U.S. national phase of PCT Patent Application No. PCT/CN2019/089992 filed on Jun. 4, 2019, which claims the priority of Chinese Patent Application No. 201810721037.1, filed on Jun. 29, 2018, the entire content of both of which is incorporated herein by reference in their entirety for all purposes.

TECHNICAL FIELD

The present disclosure relates to the field of display technologies, and in particular, to a display panel, a manufacturing method thereof, and a display device.

BACKGROUND

With the continuous advancement of display technologies, the demand for display devices is also increasing. In recent years, self-luminous display, such as micro light emitting diode (Micro LED) display, has been widely used in various electronic devices, including electronic products such as computers and mobile phones, for its properties of self-illumination, low profile, low power consumption, high contrast, high color gamut, and flexible display capability.

For a self-luminous display device, a self-illuminating unit is separately provided in each sub-pixel, and the self-illuminating unit is equivalent to a Lambertian light source that has a wide beam angle. However, due to the large angle of light emitted by the self-illuminating unit, the light may easily enter, and subsequently emit from, adjacent or other sub-pixels, thereby causing optical cross-talk, which may adversely affect the quality of the display (e.g., blurred picture, low color contrast, etc.).

SUMMARY

Embodiments of the present disclosure provide a display panel, a manufacturing method thereof, and a display device.

According to a first aspect of the present disclosure, there is provided a display panel, the display panel including: a substrate; a functional layer on the substrate having a plurality of recesses, at least one of the recesses in a sub-pixel region forming a well structure with a sidewall formed of the functional layer and a bottom formed of the substrate; and a plurality of micro light emitting diodes (Micro LEDs) for emitting light, at least one of the Micro LEDs within a corresponding recess; wherein the functional layer is configured to prevent at least part of the light emitted by one of the Micro LEDs and incident on the sidewall of the corresponding recess from being subsequently emitted through an adjacent sub-pixel region.

The functional layer may include: a waveguide layer and an upper dielectric layer sequentially disposed on the substrate.

A refractive index of the waveguide layer may be greater than refractive indices of the substrate and the upper dielectric layer, and the refractive index of the substrate may be greater than the refractive index of the upper dielectric layer.

The display panel may further include a light absorbing layer on a side of the substrate distal from the functional layer.

At least one of the Micro LEDs may be located in a central region of the corresponding recess.

The functional layer may include: a transparent dielectric layer and a reflective layer sequentially disposed on the substrate.

The reflective layer may include a reflective surface facing the substrate.

The reflective layer may include a non-reflective surface facing away from the substrate.

The display panel may further include a light absorbing layer on a side of the substrate distal from the functional layer.

The functional layer may include a light absorbing layer.

The recess may be a through hole in the functional layer.

The display panel may further include an anti-glare protective film on a side of the functional layer distal from the substrate.

The anti-glare protective film and the functional layer may be bonded by a sealing portion in a non-display area.

According to a second aspect of the present disclosure, there is provided a display device including the display panel.

According to a third aspect of the present disclosure, there is provided a method of manufacturing a display panel having a plurality of sub-pixel regions, the method including: forming a functional layer having a plurality of recesses on a substrate, at least one of the recesses at a position corresponding to one of the sub-pixel regions; and forming a micro light emitting diode (Micro LED) in at least one of the recesses for emitting light; wherein the functional layer is configured to prevent at least part of the light emitted by the Micro LED and incident on a sidewall of the corresponding recess from being subsequently emitted from an adjacent sub-pixel region.

The Micro LED may be transfer-printed into the recess.

Forming the functional layer may include: forming an initial waveguide layer and an initial upper dielectric layer on the substrate; and forming an array of recesses in the initial waveguide layer and the initial upper dielectric layer.

A refractive index of the initial waveguide layer may be greater than refractive indices of the substrate and the initial upper dielectric layer, and the refractive index of the substrate may be greater than the refractive index of the initial upper dielectric layer.

Forming the functional layer may include: forming an initial transparent dielectric layer and an initial reflective layer on the substrate; and forming an array of recesses in the initial transparent dielectric layer and the initial reflective layer.

Forming the functional layer may include: forming an initial light absorbing layer on the substrate; and forming an array of recesses in the initial light absorbing layer.

BRIEF DESCRIPTION OF DRAWINGS

A more particular description of the embodiments will be rendered by reference to specific embodiments illustrated in the appended drawings. Given that these drawings depict only some embodiments and are not therefore considered to be limiting in scope, the embodiments will be described and explained with additional specificity and details through the use of the accompanying drawings, in which.

DETAILED DESCRIPTION OF EMBODIMENTS

Figure 1:
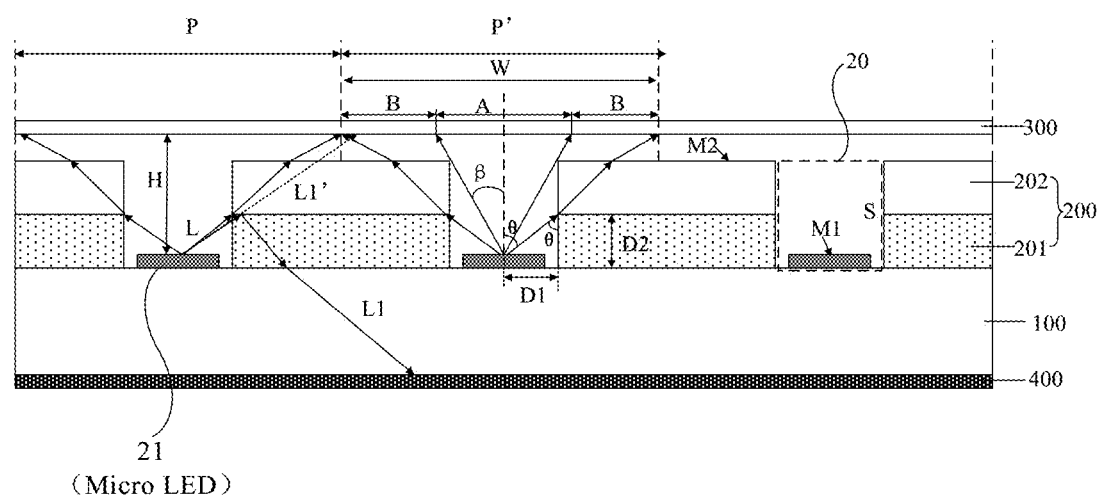
FIG. 1 is a schematic diagram of a display panel according to an embodiment of the present disclosure.

The disclosure will be described hereinafter with reference to the accompanying drawings which illustrate embodiments of the disclosure. The described embodiments are only exemplary embodiments of the present disclosure, but not all embodiments. Other embodiments may be obtained by a person of ordinary skill in the art based on the embodiments of the present disclosure without creative efforts, and are within the scope of the present disclosure.

References throughout the disclosure to "one embodiment", "an embodiment", "an example", "some embodiments", or similar language mean that a particular feature, structure, or characteristic described in connection with the embodiment is included in at least one embodiment. Thus, appearances of the phrases "in one embodiment", "in an embodiment", "in some embodiments", and similar language throughout the disclosure may, but do not necessarily, all refer to the same embodiment(s), but mean "one or more embodiments". These may or may not include all the embodiments disclosed.

Unless otherwise defined, technical terms or scientific terms used in the embodiments of the present disclosure should be construed in the ordinary meaning of the person of ordinary skill in the art.

The terms "first", "second" and similar terms used in the present disclosure do not denote any order, quantity, or importance. They are merely used for references to relevant devices, components, procedural steps, etc. These terms do not imply any spatial or chronological orders, unless expressly specified otherwise. For example, a "first device" and a "second device" may refer to two separately formed devices, or two parts or components of the same device. Similarly, a "first step" of a method or process may be carried or performed after, or simultaneously with, a 'second step".

The terms "comprising", "including", "having", and variations thereof mean "including but not limited to", unless expressly specified otherwise.

An enumerated listing of items does not imply that any or all of the items are mutually exclusive, unless expressly specified otherwise. The terms "a", "an", and "the" also refer to "one or more" unless expressly specified otherwise.

The words "connected" or "connection" and the like are not limited to physical or mechanical connections, but may include electrical connections, whether direct or indirect.

The words "upper", "lower", "left", "right" and the like are only used to indicate the relative positional relationship.

An embodiment of the disclosure provides a display panel, especially for a micro light emitting diode (Micro LED) display panel, which has the advantages of high contrast, high refresh rate, wide viewing angle, wide color gamut, high brightness and low power consumption, high durability and stability in different environments. However, there are many areas for improvement in the emerging technology of Micro LED, such as optical cross-talk, chip-on-submount test, mass-transfer process, bonding devices, etc. The optical cross-talk phenomenon or color mixing phenomenon is mainly a visible defect caused by interferences between adjacent pixels, which may lead to blurred screen display and lowered color purity, and the final display effect may be seriously degraded.

Specifically, for the color mixing phenomenon, since the single Micro LED chip in the Micro LED display panel is a Lambertian light source, the illuminating beam angle $2\theta$ reaches 120° (i.e. in this case, $\theta$ is approximately 60°). It is understood that the larger the beam angle, the lower the luminous intensity. With regard to light at a large angle (e.g. an angle greater than 60°), although the intensity of light is weak, there is still some light radiation. For the entire display panel, an image is displayed by arrangement of a large number of spaced Micro LEDs, and the light at a large angle is the main source of Micro LED optical cross-talk.

Figure 3:
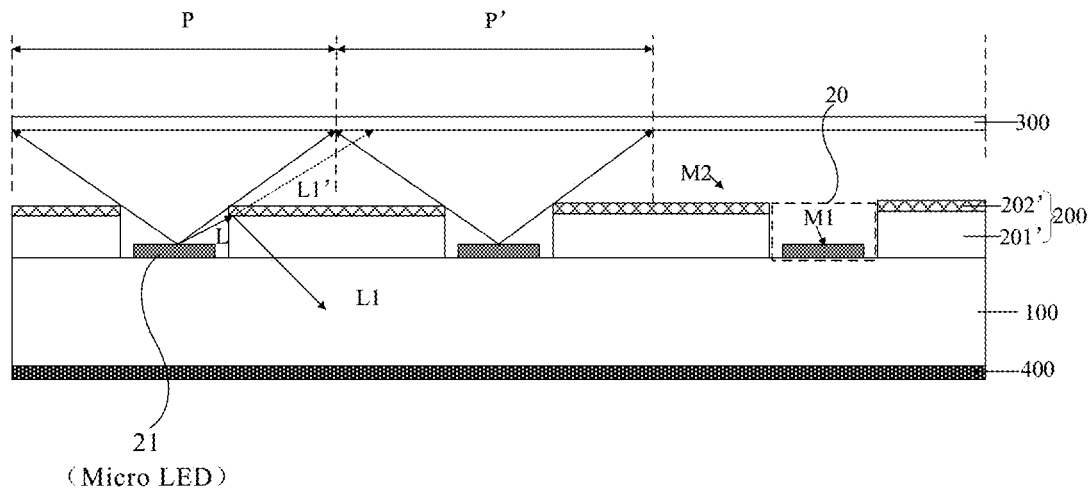
FIG. 3 is a schematic diagram of another display panel according to an embodiment of the present disclosure.
Figure 4:
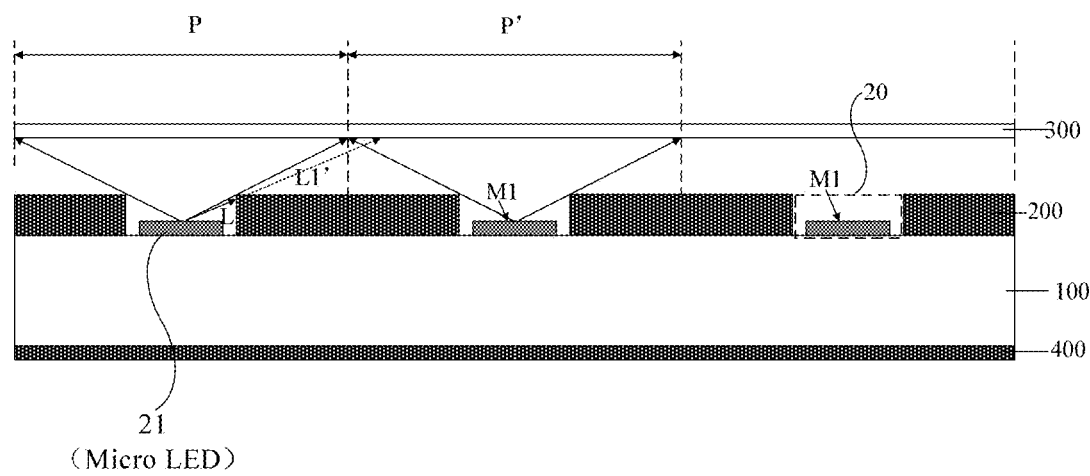
FIG. 4 is a schematic diagram of still another display panel according to an embodiment of the present disclosure.

In view of the above, as shown in FIGS. 1, 3, and 4, the Micro LED display panel 01 according to an embodiment of the present disclosure includes a plurality of sub-pixel regions, or in this case sub-pixels P (P'), and the display panel 01 further includes a substrate 100 and a functional layer 200 disposed on the substrate 100.

The functional layer 200 is provided with an array of recesses, or in this case recessed portions 20, each at a position of the functional layer 200 corresponding to, or located within, a sub-pixel P (P') region. A Micro LED 21 is disposed in each recessed portion 20. The recessed portion 20 in a sub-pixel region forms a well structure with a sidewall S formed of the functional layer 200 and a bottom formed of the substrate 100. The light emitting surface M1 of the Micro LED is closer to the substrate 100, relative to the surface M2 of the functional layer 200 facing away from the substrate side (i.e., the upper surface of the functional layer 200). That is, the light emitting surface M1 of the Micro LED is lower than the surface M2 of the functional layer distal from the substrate. In other words, the Micro LED is entirely located within the corresponding recess 20 of the functional layer 200. The light emitting face M1 does not protrude from the opening of the recessed portion 20.

The functional layer 200 is configured to prevent at least part of the light emitted by the Micro LED in the sub-pixel P and incident on the sidewall S of the recess 20 from exiting, or emitting from, the light-emitting side of the sub-pixel P' adjacent to the sub-pixel P. It is understood that the colors of the emitted light of adjacent sub-pixels are different, and optical cross-talk occurs when part of the light emitted by the Micro LED in the sub-pixel P interferences with light emitted by the Micro LED in the adjacent sub-pixel P'. Referring to FIGS. 1, 3, and 4, at least part of the light L emitted by the Micro LED 21 and incident on the sidewall S of the recess 20 (e.g. reference light ray L1' in a dotted line), which would originally be emitted toward and exit the sub-pixel P' adjacent to the sub-pixel P in absence of the functional layer 200, is prevented from entering a region of the sub-pixel P' adjacent to the sub-pixel P by the functional layer 200. That is, this part of the light (e.g. reference light ray L1') emitted by the Micro LED in the sub-pixel P which would cause optical cross-talk in absence of the functional layer 200, does not enter the region of the sub-pixel P', and thus it does not exit the display panel 01 through the sub-pixel P'.

It is understood that, first, the position of the functional layer 200 corresponding to a sub-pixel where a recess 20 is provided refers to a position of the functional layer 200 in the sub-pixel aperture area of the display panel 01.

Second, among the light emitted by the Micro LED in the sub-pixel P and incident on the sidewall S of the recess 20, the part of light that would originally exit the sub-pixel P' adjacent to the sub-pixel P (e.g. reference light ray L1') will not emit out through the sub-pixel P' adjacent to the sub-pixel P due to the presence of the functional layer. Based on the specific configuration of the functional layer 200, this part of the light may be emitted out through the sub-pixel P where the Micro LED is disposed, or it may be absorbed. The present disclosure is not limited in this aspect, as long as the functional layer 200 is capable of preventing, or blocking, at least part of the light incident on the sidewall S of the recess 20 from exiting, or being subsequently emitted, from the sub-pixel P' adjacent to the sub-pixel P. The specific ways of blocking may refer to the specific embodiments provided later.

According to an embodiment of the present disclosure, at least part of the light incident on the sidewall of the recessed portion among the light emitted by the Micro LED in a sub-pixel is prevented from exiting from adjacent sub-pixels by the functional layer (the colors of the light emitted from adjacent sub-pixels are different). Thus, the probability of occurrences of optical cross-talk is reduced, thereby providing high contrast display.

The above Micro LEDs may include Micro LEDs of three colors of red, green, and blue. Each single Micro LED generally includes an upper electrode, a lower electrode, and a light-emitting layer between the upper electrode and the lower electrode. Local dimming may be implemented by controlling the voltages applied on the upper and lower electrodes of the individual Micro LED. The material of the light-emitting layer may be GaN, GaAs, etc., and the electrode material may be metals such as silver or aluminum, which are not specifically limited in the present disclosure. In addition, each Micro LED is correspondingly provided with a Micro-IC to ensure local dimming, and the size and the optical distance of the Micro LED can be selected according to the requirements of the actual display panel, and are not limited in the present disclosure.

As shown in FIG. 1, the recessed portion 20 may be a through hole in the functional layer 200, so as to facilitate the connection of the Micro LED located in the recessed portion 20 with other electronic components (e.g., a driving circuit) located on the substrate 100 to achieve proper display.

In addition, as shown in FIG. 1, the display panel 01 is provided with an anti-glare protective film 300 on a side of the functional layer 200 distal from the substrate 100. The anti-glare protective film 300 and the functional layer 200 are bonded by a sealing portion (not shown) in a non-display area of the display panel 01. The arrangement manner and the material of the sealing portion are not limited in the present disclosure, and may be selected according to the requirements in practice. For example, a sealing material such as resin may be used to form the sealed portion between the anti-glare protective film 300 and the functional layer 200 around periphery of the non-display area.

The anti-glare protective film 300 is used to suppress whitening and glare, and is also used to achieve bonding with the sealing portion. In practice, the anti-glare protective film is generally made of high transmittance materials to avoid the reduction in the light transmittance of the display panel. For example, polyethylene terephthalate, polycarbonate, glass, or the like may be used. The material may be selected according to the requirements in practice, and is not limited in the present disclosure.

Of course, it should be understood that there is a certain gap between the anti-glare protective film 300 and the functional layer 200 that are bonded by the sealing portion, and the gap helps to adjust the optical distance to a certain extent. To avoid a change in the gap between the anti-glare protective film 300 and the functional layer 200 caused by a force exerted on the anti-glare protective film 300, thereby adversely affecting the display, support columns may be disposed between the anti-glare protective film 300 and the functional layer 200 in practice. The support columns may generally be disposed between adjacent sub-pixels to avoid affecting the display.

The specific configuration of the above functional layer 200 will be further described below.

Figure 2:
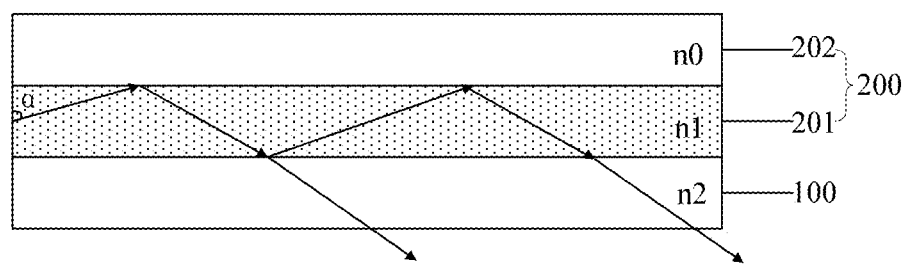
FIG. 2 is a schematic diagram illustrating a part of the display panel of FIG. 1.

Configuration 1:

As shown in FIG. 1, the functional layer 200 may include a waveguide layer 201 and an upper dielectric layer 202 which are sequentially disposed on the substrate 100. Referring to FIG. 2, a schematic diagram including the waveguide layer 201 of FIG. 1, the refractive index n1 of the waveguide layer 201 is greater than the refractive index n2 of the substrate 100 as well as the refractive index n0 of the upper dielectric layer 202; and the refractive index n2 of the substrate is greater than the refractive index n0 of the upper dielectric layer; that is, $n1 > n2 > n0$.

In this case, it should be understood that for the waveguide layer 201, the critical angle of the light entering the upper dielectric layer 202 from the waveguide layer 201, or the critical angle of total internal reflection of the light is $C1 = \arcsin(n0/n1)$. The critical angle of the light entering the substrate 100 from the waveguide layer 201 is $C2 = \arcsin(n2/n1)$. By selecting appropriate refractive index n1 of the waveguide layer 201, refractive index n2 of the substrate 100, and refractive index n0 of the upper dielectric layer 202, part of the light entering the waveguide layer 201 with the incident angle $\alpha$ satisfying $\arcsin(n0/n1) = C1 < \alpha < C2 = \arcsin(n2/n1)$ is totally reflected at the interface between the waveguide layer 201 and the upper dielectric layer 202 (i.e. at the upper surface of the waveguide layer 201); and this part of the light that undergoes total internal reflection at the above surface is then enters the substrate 100 since the condition of total reflection at the interface between the waveguide layer 201 and the substrate 100 (i.e. at the lower surface of the waveguide layer 201) is set to be unsatisfied. This prevents this part of the light exits through or emitted from, adjacent sub-pixels, reducing the chances of optical cross-talk.

It should be noted that the substrate 100, the waveguide layer 201, and the upper dielectric layer 202 are generally transparent media. The substrate 100 and the waveguide layer 201 may generally be made of optical glass, transparent resin materials, etc. Its thickness may be determined by specific product designs or process conditions. For example, the substrate 100 is made of optical glass having a refractive index of $n2 = 1.52$ with a thickness of about 0.5 mm, and the waveguide layer 201 is made of optical glass of SiO2 having a refractive index of 1.63-1.64.

In addition, the upper dielectric layer 202 may be an air dielectric layer, or it may be a special optical glass having a low refractive index, a transparent resin material, and the like. Its thickness may be determined by specific product designs or process conditions. In practice, the upper dielectric layer 202 may preferably be a non-air transparent dielectric layer made of materials such as optical glass or transparent resin. For example, according to an embodiment of the present disclosure, optical glass having a refractive index of n0=1.46 with a thickness of about 2 μm may be used. The lower surface of the optical glass is required to have relatively better flatness and parallelism to ensure total internal reflection at the interface.

It should be understood that in the case where the upper dielectric layer 202 is an air dielectric layer, the foregoing anti-glare protective film 300 is actually bonded with the waveguide layer 201 of the functional layer 200 by a sealing portion (not shown in the figures) located in the non-display area.

To illustrate further with reference to FIG. 2, in an exemplary display panel, the substrate 100 is made of a low refractive index SiO2 material having a refractive index n2 of 1.52; the upper dielectric layer 202 is made of optical glass having a refractive index n0 of 1.46; the waveguide layer 201 is made of glass having a refractive index n1 of 1.64 (for example, Nippon Glass); and the incident angle of the light incident on the waveguide layer 201 is greater than 64°. Using a model established based on the FDTD (Finite-Difference Time-Domain) method and detecting the intensities of light exiting the upper dielectric layer 202 and the substrate 100 by a power monitor, the specific light intensities obtained are listed in the following table.

| Incident angle | Intensity of light exiting upper dielectric layer | Intensity of light exiting substrate | Ratio of intensity of light exiting substrate to that of light exiting upper dielectric layer |
| --- | --- | --- | --- |
| 65 | 2.85E−11 | 0.52 | 1.83E+10 |
| 67 | 3.50E−11 | 0.015 | 4.17E+10 |
| 70 | 1.66E−11 | 0.004 | 2.11E+10 |

It can be seen from the above table that when the incident angle of light incident on the waveguide layer is between 65° and 70°, the intensity of light exiting the substrate is much greater than the intensity of light exiting the upper dielectric layer. That is, most of the light with incident angle $\alpha$ of between 65° and 70° is emitted from or exiting the substrate. The upper dielectric layer does not emit light substantially (in this case, the waveguide layer achieves the purpose of single-sided light emission). Therefore, the light incident on the side surface of the waveguide layer with incident angle $\alpha$ of between 65° and 70° is not emitted through the upper dielectric layer substantially, which can satisfactorily achieve the purpose of reducing optical cross-talk and ensuring high contrast of the display images.

In practice, the differences among the refractive indices of the substrate 100, the upper dielectric layer 202 and the waveguide layer 201, and the thickness of each layer can be controlled as required, to in order to reduce chances of occurrences of optical cross-talk.

Compared to the related art in which serious optical cross-talk exists in high-resolution (high PPI) display panels, the design according to the present disclosure achieves a better result in reducing the occurrences of optical cross-talk. Besides reducing the occurrences of optical cross-talk, the embodiments according to the present disclosure also ensure a further reduction in the size of sub-pixels including the Micro LEDs, thereby realizing high PPI (pixels per inch) display.

In the case that the Micro LED is located in the central region of the recessed portion 20, the width W of the sub-pixel P preferably may be 2H tan θ (or approximately 2H tan θ according to the actual case) to minimize the size of the sub-pixels.

Here, H is the distance from the Micro LED to the display surface (or the light exit surface) of the display panel; and tan θ is the ratio of the distance D1 from the center of the recessed portion 20 to the sidewall of the recessed portion to the thickness D2 of the waveguide layer 201, i.e. tan θ=D1/D2.

It should be noted here that, first, the "center of the recessed portion" refers to a position in the concave portion or the well structure, which is of equal distances or approximately equal distances to the sidewalls of the recessed portion. In practice, in order to ensure the uniformity of the light emitted by each Micro LED in the display panel, the Micro LED is generally disposed at the center of the recess 20. The abovementioned "central region" may be considered as the region where the Micro LED is disposed in the recess 20, so as to ensure that the distances from the Micro LED to the sidewalls on the periphery of the recess are equal or approximately equal, thereby ensuring uniformity of extracted or emitted light.

Second, the width of the sub-pixel P refers to a dimension of the sub-pixel P in a direction in which sub-pixels are likely to cause optical cross-talk. For example, in general, adjacent sub-pixels in the gate line direction are of different colors, and color mixing or optical cross-talk readily occurs. The width of the sub-pixel is a dimension of the sub-pixel along the gate line direction. However, the present disclosure is not limited thereto, and if the colors of the adjacent sub-pixels in the direction of the data line are different such that color mixing readily exits in this direction, the width of the sub-pixel P may be a dimension along the direction of the data line. Of course, other situations are also possible, but are not repeatedly described herein.

Third, one skilled in the art should understand that for the display panel as shown in FIG. 1, the light emitting area of a sub-pixel region including a Micro LED can be divided into two parts: a first part and a second part. The first part is a region that is covered by the light emitted by the Micro LED having a radiation angle (from the center to the periphery) smaller than β. The light emitted by the Micro LED directly irradiates on this region, forming a central region, i.e. Region A in FIG. 1. The second part is a region that is covered by the light emitted by the Micro LED having a radiation angle of between β and θ and passed through the upper dielectric layer 202, forming a peripheral region, i.e. Region B in FIG. 1. The design of W=2H tan θ according to an embodiment of the present disclosure ensures that the light from adjacent Micro LEDs do not overlap in Regions B of the sub-pixels. That is, it is ensured that the outgoing light of each Micro LED can exit from the corresponding sub-pixel (Region A and Region B of the sub-pixel), and the light having an angle of radiation greater than θ (e.g. light ray L1) among all outgoing light of the Micro LED is totally internal reflected at the interface between the upper dielectric layer 202 and the waveguide layer 201 (i.e. being prevented from exit through an adjacent sub-pixel). The light ray L1 subsequently enters the substrate 100 and is absorbed within the display panel.

Configuration 2:

As shown in FIG. 3, the functional layer 200 includes a transparent dielectric layer 201' and a reflective layer 202' sequentially disposed on the substrate 100. The reflective layer 202' includes a reflective surface facing the substrate 100 such that light incident on the transparent dielectric layer 201' of the sidewall of the recess 20 is reflected by the reflective layer 202' after entering the dielectric layer 201' and enters the substrate 100 (refer to light ray L1 in FIG. 3), thereby preventing this part of the light from exiting through adjacent sub-pixels (refer to light ray L1' in FIG. 3 which shows the light passage in absence of the functional layer 200), and thus reducing the chances of optical cross-talk. The reflective layer 202' may include a non-reflective surface facing away from the substrate 100.

In this case, the transparent dielectric layer 201' may be made of optical glass, transparent resin materials or the like; the reflective layer 202' may be made of metal materials, such as Al or Ag. It is understood that in the case where a metal reflective layer is used, the light is radiated to a layer of micron-sized metal and thus a plasmonic effect may be introduced. In practice, monitoring may be used to eliminate such influence.

Configuration 3:

As shown in FIG. 4, the functional layer 200 is a light absorbing layer; and it is generally made of a light absorbing material, such as black resin materials. Thus, light incident on the sidewall of the recessed portion 20 can be absorbed, thereby avoiding this part of light (refer to light ray L1' in FIG. 4) exiting or emitted through adjacent sub-pixels, and thus reducing the occurrences of optical cross-talk.

It should be noted that the substrate 100 in this configuration may be made of a transparent material (for example, optical glass, transparent resin, or the like) or a non-transparent material, which is not limited in the present disclosure. In practice, the material may be selected according to requirements.

With respect to the functional layers of the above three configurations, it should be understood that in the second and third configurations, the light incident on the sidewall of the recessed portion 20 is substantially ineffectively utilized; whereas the functional layer of the first configuration can effectively utilize part of the light incident on the sidewall of the recess 20 (that is, part of the light incident on the upper dielectric layer 202 that then irradiates to Region B of the sub-pixel) by using the waveguide layer 201, thereby improving the light utilization of the display panel as a whole (refer to the outgoing light rays in Region B in FIG. 1). Therefore, the functional layer 200 in the first configuration may be provided as a preferred arrangement according to an embodiment of the present disclosure.

In addition, compared with the third configuration in which the light incident on the sidewall of the recessed portion 20 is absorbed by the functional layer and does not enter the substrate 100, the light incident on the sidewall of the recessed portion 20 in the first and second configurations may be emitted from or exit the substrate 100. In view of this, in order to avoid the light being emitted from or exiting the substrate 100 which adversely affects the display, it may be generally preferred to provide a light absorbing layer 400 on a side of the substrate 100 facing away from the functional layer 200 as shown in to FIGS. 1 and 3. The light absorbing layer 400, which is different from the light absorbing layer as the functional layer 200 in the third configuration, is configured to absorb light exiting the substrate 100.

The embodiments of the disclosure further provide a display device comprising the foregoing display panel, which has the same structure and advantageous effects as the display panel provided by the foregoing embodiments. Since the foregoing embodiments have been described in detail regarding the structure and advantageous effects of the display panel, details of the display device are not described herein again.

It should be noted that, in the embodiments of the present disclosure, the display device may specifically include at least a Micro LED display device. For example, the display device may be applied to any product or component having a display function, such as a monitor, a television, a digital photo frame, a mobile phone, or a tablet computer.

It should be understood that, with respect to the display device of the present disclosure, the size of the sub-pixels can be further reduced to facilitate high PPI display design due to the reduced occurrences of the color mixing phenomenon or optical cross-talk. In addition, it should also be understood that the Micro LED display device of the present disclosure can realize fast response and local dimming, and can be applied to fields such as flexible display, AR/VR display and the like.

Figure 5:
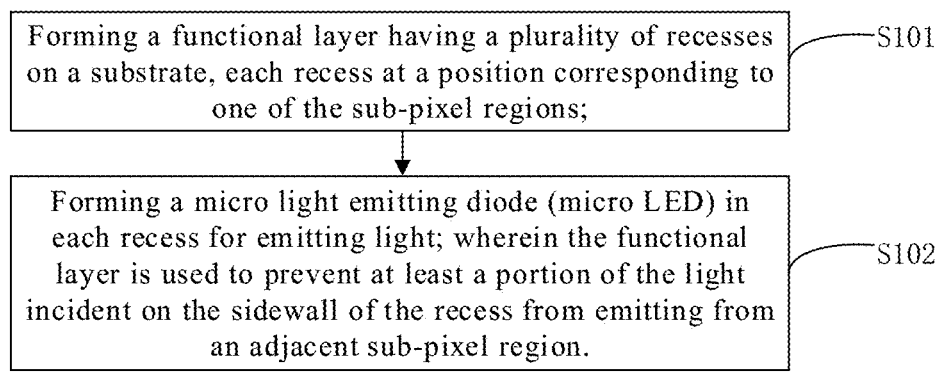
FIG. 5 is a flowchart of manufacturing a display panel according to an embodiment of the present disclosure.

The embodiments of the disclosure further provide a method for manufacturing a display panel. The display panel includes a plurality of sub-pixels. As shown in FIG. 5, the manufacturing method includes:

Step S101, forming a functional layer 200 having a plurality of recessed portions or recesses 20 on a substrate 100, each recess at a position corresponding to one sub-pixel P, or one sub-pixel region, on the substrate 100.

Step S102, forming a Micro LED in each recess 20 for emitting light. The light emitting surface of the Micro LED is closer to the substrate 100 with respect to the surface of the functional layer 200 distal from the substrate 100; and the functional layer 200 is configured to prevent at least part of the light emitted by the Micro LED in the sub-pixel P and incident on a sidewall of the corresponding recess 20 from being subsequently emitted though or exit the sub-pixel P' adjacent to the sub-pixel P (refer to FIGS. 1, 3, and 4).

According to the present disclosure, at least part of the light incident on the sidewall of the recess among the light emitted by the Micro LED in the sub-pixel is prevented from being emitted though or exit the adjacent sub-pixels by the functional layer (the colors of the light emitted from the adjacent sub-pixels are different). This thus reduces the chances of optical cross-talk, which in turn ensures high contrast of the display.

Specifically, the above step S101 is further described in association with the three configuring manners of the functional layer 200 in the foregoing embodiments of the display panel 01.

Referring to the foregoing configuration 1 and FIG. 1, forming the functional layer 200 having a plurality of recesses 20 on the substrate 100, each recess at the position of the corresponding sub-pixel P, in the above step S101 may include:

forming an initial waveguide layer and an initial upper dielectric layer on the substrate 100; wherein a refractive index of the initial waveguide layer is greater than refractive indices of the substrate and the initial upper dielectric layer, and the refractive index of the substrate is greater than the refractive index of the initial upper dielectric layer; and forming an array of recesses 20 at positions of the initial waveguide layer and the initial upper dielectric layer corresponding to each sub-pixel to form the functional layer 200.

Figure 6A:
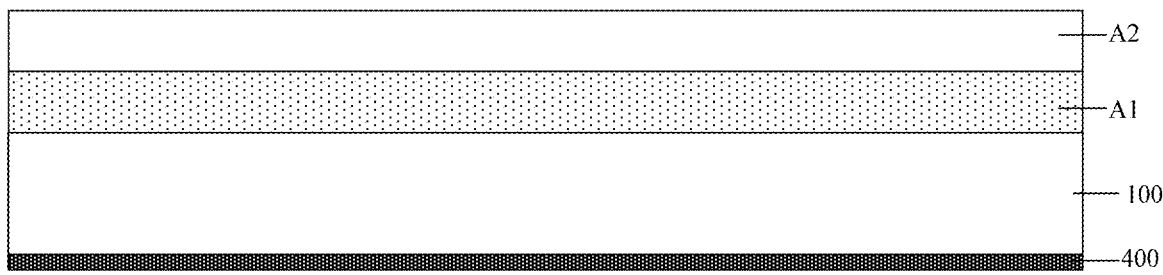
FIG. 6a is a schematic diagram of a display panel during a manufacturing process according to an embodiment of the present disclosure.

Specifically, referring to FIG. 6a, the initial waveguide layer A1 and the initial upper dielectric layer A2 may be sequentially formed on the substrate 100 by deposition.

Figure 6B:
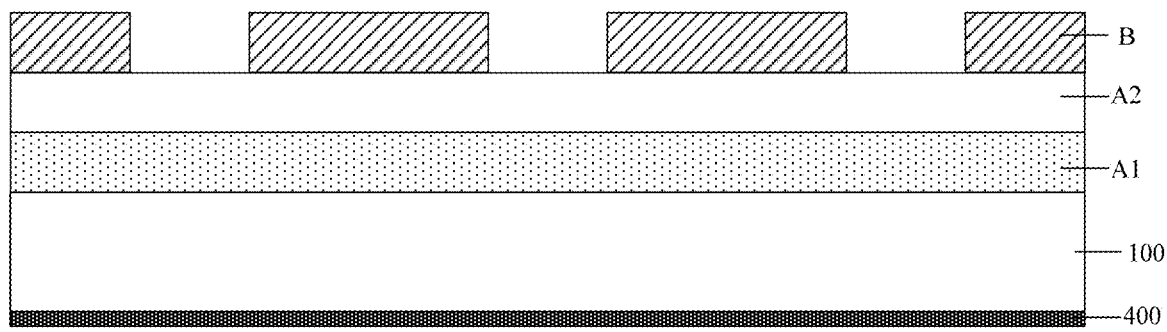
FIG. 6b is a schematic diagram of a display panel during a manufacturing process according to an embodiment of the present disclosure.
Figure 6C:
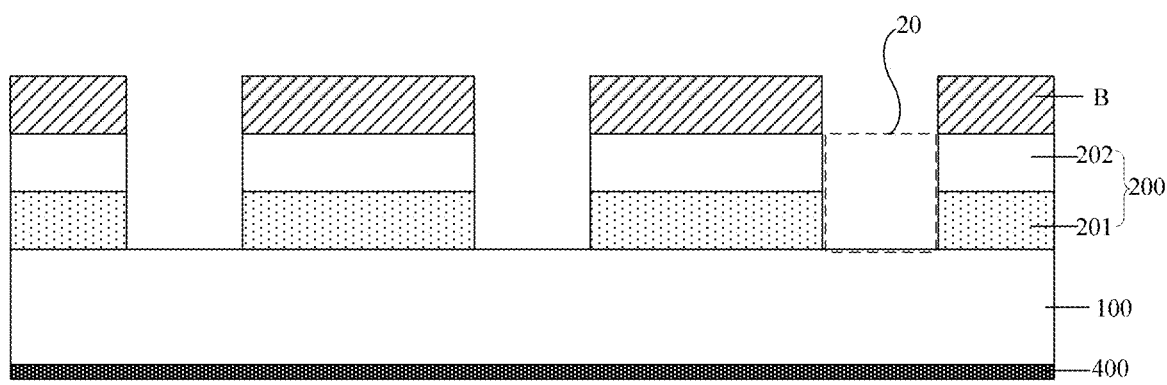
FIG. 6c is a schematic diagram of a display panel during a manufacturing process according to an embodiment of the present disclosure.
Figure 6D:
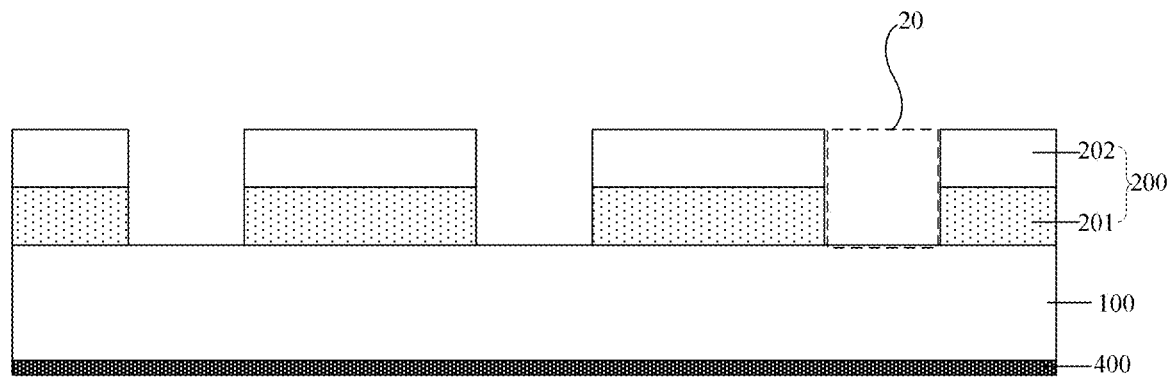
FIG. 6d is a schematic diagram of a display panel during a manufacturing process according to an embodiment of the present disclosure.

Then, by spin-coating the photoresist layer B on the initial upper dielectric layer A2 and using digital exposure, laser direct writing, imprinting, etc., a hollow region is formed at positions corresponding to each sub-pixel region in the photoresist layer B (refer to FIG. 6b). Through an etching process (dry etching or wet etching), the recessed portions or recesses 20 are then formed at positions corresponding to the hollow regions of the photoresist layer B (refer to FIG. 6c), and finally the photoresist is peeled off to complete the fabrication of the functional layer 200 (refer to FIG. 6d).

Of course, it should be understood that the specific manufacturing process of the functional layer 200 herein merely provides an example of the manufacturing process, but the present disclosure is not limited thereto. In practice, other suitable processes may be selected according to requirements, such as inkjet printing.

Referring to the foregoing configuration 2 and FIG. 3, forming the functional layer 200 having a plurality of recesses 20 on the substrate 100, each recess at the position of the corresponding sub-pixel P, in the above step S101 may include:

forming an initial transparent dielectric layer and an initial reflective layer on the substrate 100; and forming an array of recesses 20 at positions of the initial transparent dielectric layer and the initial reflective layer corresponding to each sub-pixel P to form the functional layer 200.

For the specific production process, reference may be made to the specific manufacturing process of the functional layer in the foregoing configuration 1, and the details are not described herein again.

Referring to the foregoing configuration 3 and FIG. 4, forming the functional layer 200 having a plurality of recesses 20 on the substrate 100, each recess at the position of the corresponding sub-pixel P, in the above step S101 may include:

forming an initial light absorbing layer on the substrate 100; and forming an array of recesses 20 at positions of the initial light absorbing layer corresponding to the sub-pixels P to form the functional layer 200.

For the specific production process, reference may be made to the specific manufacturing process of the functional layer in the foregoing configuration 1, and the details are not described herein again.

Figure 6E:
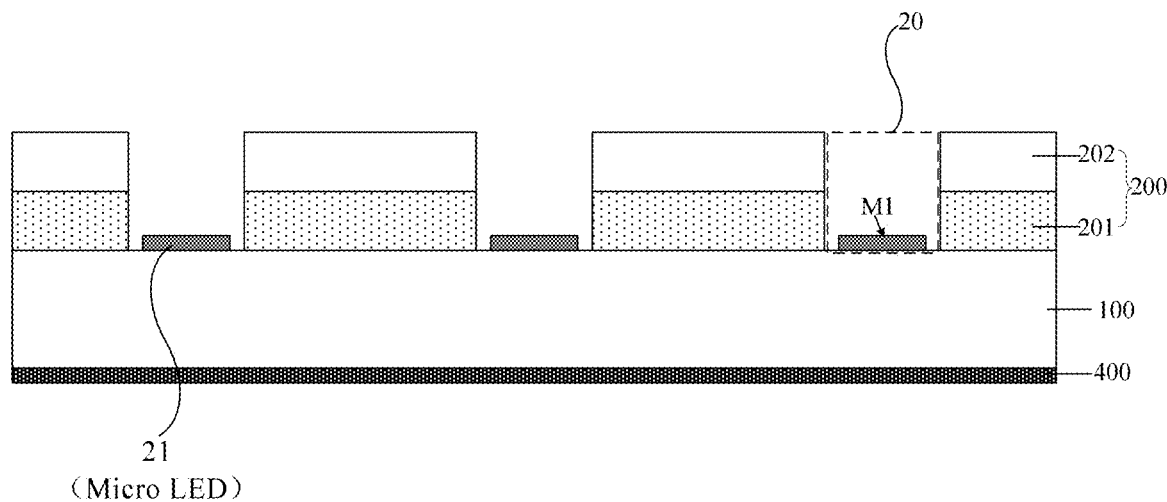
FIG. 6e is a schematic diagram of a display panel during a manufacturing process according to an embodiment of the present disclosure.

In addition, in the above step S102, forming the Micro LED in the corresponding recess may include transfer-printing the Micro LED into the corresponding recess 20 (refer to FIG. 6e).

Specifically, a plurality of Micro LEDs is formed on a temporary substrate, each Micro LED being formed in a one-to-one correspondence with a corresponding recessed portion 20, and then the Micro LEDs are transfer-printed into the recesses 20.

Of course, for related contents in the manufacturing method, reference may be made to the corresponding part in the foregoing embodiments of the display panel, and the details are not described herein again. For other configuring structures in the foregoing embodiments of the display panel, an appropriate manufacturing method may be selected for production, and the details will not be repeated here.

The above embodiments are merely exemplary embodiments of the present disclosure, and the scope of the present disclosure is not limited thereto. A person skilled in the art can easily think of modifications or substitutions within the technical scope of the present disclosure, and those modifications and substitutions are deemed to fall within the protection scope of the present disclosure.

The invention claimed is:

1. A display panel, comprising:
   a substrate;
   a functional layer on the substrate having a plurality of recesses, at least one of the recesses in a sub-pixel region forming a well structure with a sidewall formed of the functional layer and a bottom formed of the substrate; and
   a plurality of micro light emitting diodes (Micro LEDs) for emitting light, at least one of the Micro LEDs within a corresponding recess;
   wherein the functional layer is configured to prevent at least part of the light emitted by one of the Micro LEDs and incident on the sidewall of the corresponding recess from being subsequently emitted through an adjacent sub-pixel region, the functional layer comprises a reflective layer, and the reflective layer comprises a reflective surface facing the substrate.

2. The display panel according to claim 1, wherein the functional layer comprises: a waveguide layer and an upper dielectric layer sequentially disposed on the substrate.

3. The display panel according to claim 2, wherein a refractive index of the waveguide layer is greater than refractive indices of the substrate and the upper dielectric layer, and the refractive index of the substrate is greater than the refractive index of the upper dielectric layer.

4. The display panel according to claim 3, wherein the display panel further comprises a light absorbing layer on a side of the substrate distal from the functional layer.

5. The display panel according to claim 2, wherein at least one of the Micro LEDs is located in a central region of the corresponding recess.

6. The display panel according to claim 1, wherein the functional layer comprises: a transparent dielectric layer and the reflective layer sequentially disposed on the substrate.

7. The display panel according to claim 6, wherein the display panel further comprises a light absorbing layer on a side of the substrate distal from the functional layer.

8. The display panel according to claim 1, wherein the reflective layer comprises a non-reflective surface facing away from the substrate.

9. The display panel according to claim 1, wherein the functional layer comprises a light absorbing layer.

10. The display panel according to claim 1, wherein the recess is a through hole in the functional layer.

11. The display panel according to claim 1, wherein the display panel further comprises an anti-glare protective film on a side of the functional layer distal from the substrate.

12. The display panel according to claim 11, wherein the anti-glare protective film and the functional layer are bonded by a sealing portion in a non-display area.

13. A display device comprising a display panel, wherein the display panel comprises:
   a substrate;
   a functional layer on the substrate having a plurality of recesses, at least one of the recesses in a sub-pixel region forming a well structure with a sidewall formed of the functional layer and a bottom formed of the substrate; and
   a plurality of micro light emitting diodes (Micro LEDs) for emitting light, at least one of the Micro LEDs within a corresponding recess;
   wherein the functional layer is configured to prevent at least part of the light emitted by one of the Micro LEDs and incident on the sidewall of the corresponding recess from being subsequently emitted through an adjacent sub-pixel region, the functional layer comprises a reflective layer, and the reflective layer comprises a reflective surface facing the substrate.

\* \* \* \* \*